(12) United States Patent
Matsunaga et al.

(10) Patent No.: US 12,289,553 B2
(45) Date of Patent: Apr. 29, 2025

(54) PHOTO-VOLTAIC PHOTOTRANSISTOR IN FORWARD BIAS

(71) Applicant: OmniVision Technologies, Inc., Santa Clara, CA (US)

(72) Inventors: Yoshiyuki Matsunaga, Kyoto (JP); Keiji Mabuchi, Cupertino, CA (US); Lindsay Alexander Grant, Campbell, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 18/457,015

(22) Filed: Aug. 28, 2023

(65) Prior Publication Data
US 2025/0080876 A1    Mar. 6, 2025

(51) Int. Cl.
*H04N 25/77* (2023.01)
*H04N 25/57* (2023.01)
*H04N 25/63* (2023.01)
*H10F 30/282* (2025.01)

(52) U.S. Cl.
CPC ............. *H04N 25/77* (2023.01); *H04N 25/63* (2023.01); *H04N 25/57* (2023.01); *H10F 30/282* (2025.01)

(58) Field of Classification Search
CPC ........ H04N 25/77; H04N 25/63; H04N 25/57; H01L 31/1136
See application file for complete search history.

(56) References Cited

U.S. PATENT DOCUMENTS

| | | | | |
|---|---|---|---|---|
| 4,996,573 | A | * | 2/1991 | Hack ................... H01L 27/1443 257/E27.128 |
| 2003/0150979 | A1 | * | 8/2003 | Lauffenburger .......... G01J 1/44 250/214 R |
| 2007/0235753 | A1 | * | 10/2007 | Debucquoy .......... H10K 10/488 257/113 |
| 2021/0084243 | A1 | | 3/2021 | Ni | |

* cited by examiner

*Primary Examiner* — Jennifer D Bennett

(57) ABSTRACT

A pixel circuit includes: a phototransistor configured to receive, by one region of a source and a drain, inflow of photo-carriers generated by light entering a substrate, and configured to output a voltage signal from the one region; and a blocking layer provided on another region of the drain and the source and on a side of a channel far from a surface, and configured to prevent the photo-carriers from directly flowing into the other region. The phototransistor causes a sub-threshold current to flow between the source and the drain in a pinch-off state. Each of the source and the drain of the phototransistor is periodically reset to a reset voltage. The reset voltage is set to a voltage between a voltage at which a dark current of the phototransistor becomes zero and a voltage at which a bias voltage of the phototransistor becomes zero.

12 Claims, 12 Drawing Sheets

PHOTO-VOLTAIC PHOTOTRANSISTOR IN FORWARD BIAS

TECHNICAL FIELD

The present disclosure generally relates to a pixel circuit operating in a photovoltaic mode.

BACKGROUND INFORMATION

An imaging device is demanded to be increased in a dynamic range. An imaging device that operates in a photovoltaic mode using logarithmic characteristics of a diode is known, and the dynamic range of the imaging device can be increased.

An example of a configuration of an imaging device operating in a photovoltaic mode was based on for the disclosure. The logarithmic characteristics are also called diode characteristics or exponential characteristics. A mode using the characteristics is called the photovoltaic mode.

SUMMARY

A pixel circuit of an imaging device according to the present disclosure includes: a phototransistor including a source and a drain provided on both sides of a channel on a surface portion of a substrate, configured to receive, by one region of the source and the drain, inflow of photo-carriers generated by light entering the substrate, and configured to output a voltage signal from the one region; and a blocking layer provided on another region of the drain and the source and on a side of the channel far from the surface, and configured to prevent the photo-carriers from directly flowing into the other region. The phototransistor causes a sub-threshold current to flow between the source and the drain in a pinch-off state where photo-carriers pass through a bulk channel at a position separated from the surface in the channel. Each of the source and the drain of the phototransistor is periodically reset to a reset voltage.

The reset voltage is preferably set to cause a dark current of the phototransistor to become zero.

Further, the reset voltage is preferably set to cause a bias voltage of the phototransistor to become zero.

The reset voltage is preferably set to a voltage between a voltage at which a dark current of the phototransistor becomes zero and a voltage at which a bias voltage of the phototransistor becomes zero.

A pixel circuit of an imaging device according to the present disclosure includes: a photodiode configured to accumulate photo-carriers generated by incident light and to output a voltage signal, and having an output voltage that is linearly varied at a predetermined accumulation number or less of photo-carriers and is logarithmically varied at the predetermined accumulation number or more of photo-carriers; and a reset transistor configured to periodically reset the photo-carriers accumulated in the photodiode. A reset voltage at the reset is set to a voltage causing a bias voltage to become zero.

According to the present disclosure, it is possible to obtain the imaging device operating in a photovoltaic mode, and to suppress dispersion of an obtained image.

BRIEF DESCRIPTION OF THE DRAWINGS

Embodiment(s) of the present disclosure will be described based on the following figures, wherein.

DETAILED DESCRIPTION

An embodiment of the present disclosure is described below with reference to drawings. The following embodiment does not limit the present disclosure, and configurations obtained by selectively combining a plurality of illustrations are also included in the present disclosure.

Pixel Circuit Configuration

Figure 1:
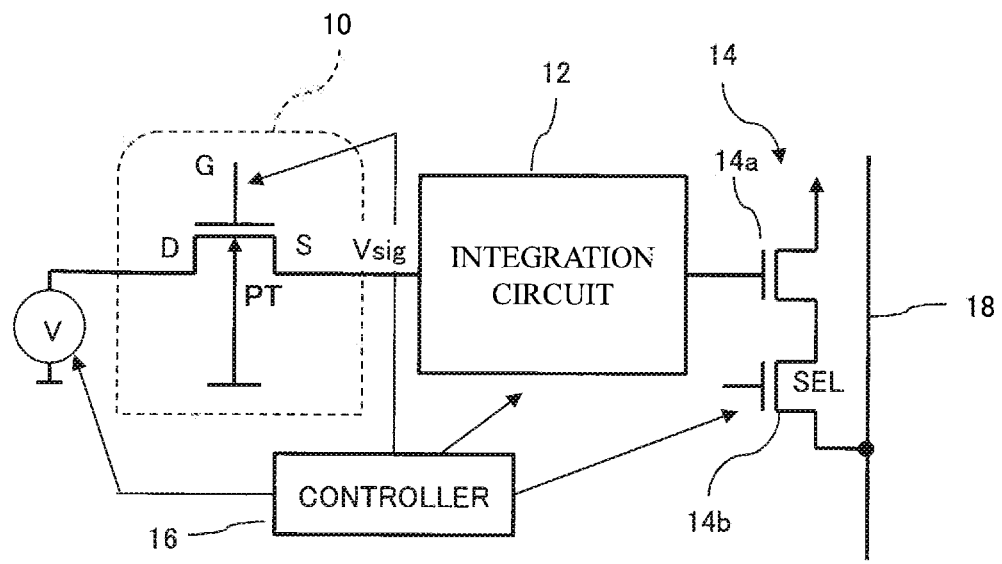
FIG. 1 is a diagram illustrating a configuration of a pixel circuit.

FIG. 1 is a diagram illustrating a configuration of a pixel circuit of an imaging device according to the embodiment. A phototransistor (PT) 10 is an n-channel field effect transistor (FET). Photo-carriers (electrons) generated by incidence of light enter from a pn junction to a source. As a result, the electrons are accumulated in the source, and a source voltage is varied based on an accumulation number of electrons. Further, the source voltage is output as a voltage signal.

As described below, the phototransistor 10 is in a pinch-off state in which a gate has a negative voltage in a normal operation state, and a channel region is not a depletion layer. In a case where a diffusion distance of the electrons in a non-depleted bulk channel region is longer than a gate length, a current flows through the bulk channel by setting a voltage of a drain to a predetermined high voltage as compared with the source, even in the pinch-off state. When a sub-threshold current flows through the bulk channel, variation of the source voltage to the light incident amount has logarithmic characteristics. In other words, the phototransistor 10 operates in the photovoltaic mode. The voltage of the drain of the phototransistor 10 is set by a power supply V.

When the gate voltage of the phototransistor 10 becomes a threshold voltage or more, the phototransistor 10 is turned on, and the drain and the source become conductive. Accordingly, the source voltage becomes equal to the drain voltage, and the voltage signal from the source is reset. In this example, the phototransistor 10 is turned on at the time of reset, and the drain voltage (reset voltage) at this time is set to an appropriate voltage as described below by the power supply V.

The source of the phototransistor 10 is connected to an integration circuit 12. The integration circuit 12 integrates an output (voltage signal corresponding to light incident amount) from the source of the phototransistor 10 for a predetermined time, and outputs a stable voltage. The integration circuit 12 is connected to an output circuit 14. The output circuit 14 includes a source follower transistor 14a and a row selection transistor (SEL) 14b. An output of the integration circuit 12 is connected to a gate of the source follower transistor 14a. The source follower transistor 14a is an n-channel FET. A drain of the source follower transistor 14a is connected to a power supply of a predetermined potential, and a source is connected to a drain of the row selection transistor 14b. The row selection transistor 14b is an n-channel FET, and a source is connected to an output line 18 in a column direction.

Accordingly, when the row selection transistor 14b is turned on, a current corresponding to a gate potential of the source follower transistor 14a flows through the source follower transistor 14a, and is output to the output line 18. A gate of the row selection transistor 14b is supplied with a row selection signal. When the row selection signal becomes an H level at a predetermined timing, a signal about a light reception amount of a pixel integrated by the integration circuit 12 is output to the output line 18.

The gate voltage of the phototransistor 10, an output voltage of the power supply V, and integration by the integration circuit 12, and on/off of the row selection transistor 14b can be controlled by a controller 16. The controller can be configured as a part of a controller controlling the whole of a plurality of pixels arranged in a matrix.

Configuration of Phototransistor

Figure 2:
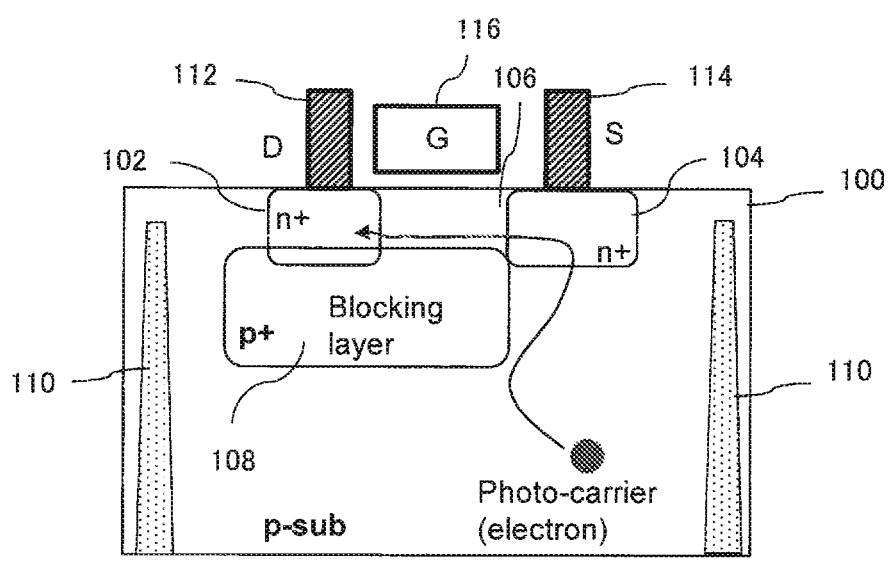
FIG. 2 is a schematic view illustrating a configuration of one phototransistor 10.

FIG. 2 is a schematic view illustrating a configuration of one phototransistor 10. The phototransistor 10 is a metal-oxide-semiconductor field-effect transistor (MOSFET). A source 104 and a drain 102 that are separated by a predetermined distance are provided on a surface portion of a p-type semiconductor substrate 100 doped with p-type impurities. The source 104 and the drain 102 are n+ regions doped with high-density n-type impurities. A region sandwiched between the source 104 and the drain 102 serves as a channel 106.

Further, a p+-type blocking layer 108 doped with high-density p-type impurities is provided to cover lower sides of the drain 102 and the channel 106. In the semiconductor substrate 100, a region of the phototransistor 10 is isolated from regions of adjacent phototransistors 10 by pixel isolation portions 110.

A source electrode 114 is connected to a surface of the source 104, and a drain electrode 112 is connected to a surface of the drain 102. Further, a gate electrode 116 is disposed on a surface of the channel 106 through a gate oxide film.

The semiconductor substrate 100 is a p-type silicon substrate (denoted by p-sub in drawing) in the above-described example, and each of the pixel isolation portions 110 is made of an insulator such as silicon oxide. Further, each of the source electrode 114, the drain electrode 112, and the gate electrode 116 is made of a conductive material such as copper, aluminum or doped poly silicon.

The p-type semiconductor substrate 100 is connected to a predetermined low-voltage power supply described below such as ground, and holes generated by incidence of light flow into the predetermined low-voltage power supply.

In FIG. 2, motion of a photo-carrier (electron in this example) in the photovoltaic mode is illustrated. As illustrated, the electron generated by photoelectric conversion in the semiconductor substrate 100 flows into the source 104 of the pinched-off phototransistor 10. Further, the electron flows into the drain through the non-depleted bulk channel separated from a pinched-off interface. In other words, the sub-threshold current flows through the bulk channel. The blocking layer 108 blocks the electron generated inside the semiconductor substrate 100 from directly flowing into the drain 102.

Figure 3:
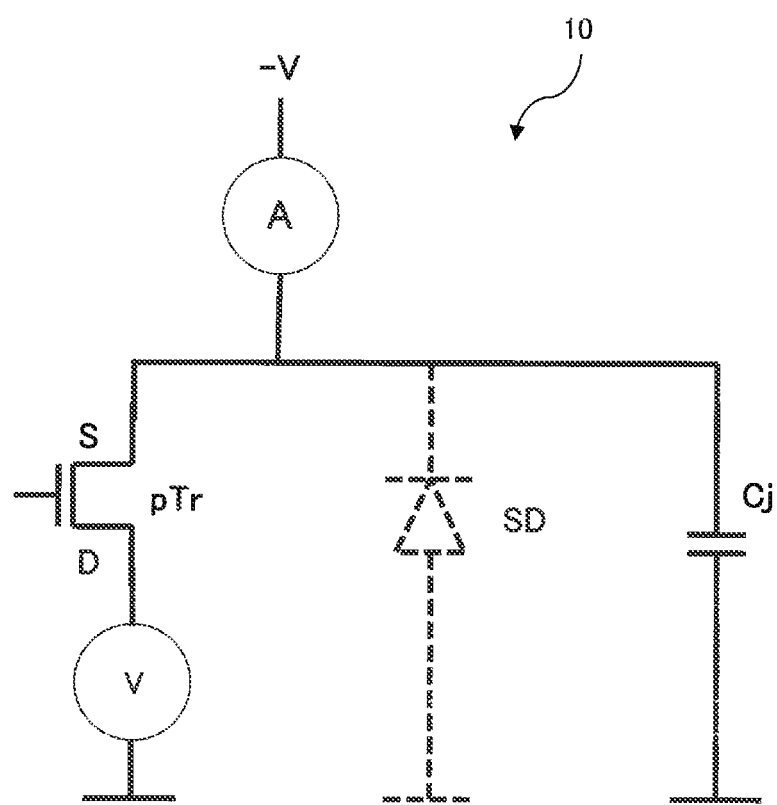
FIG. 3 is a diagram illustrating an equivalent circuit when VI characteristics of the phototransistor 10 are measured.

FIG. 3 is a diagram illustrating an equivalent circuit when VI characteristics of the phototransistor 10 are measured. The phototransistor 10 includes a pinch-off transistor pTr in which the electrons move from the source 104 to the drain 102 in FIG. 2, a source diode in which the electrons flow toward the source 104, and a capacitor Cj accumulating the electrons of the source 104. In other words, the source 104 can accumulate a predetermined number of electrons. Therefore, the capacitor Cj is illustrated in the equivalent circuit.

A drain of the pinch-off transistor pTr is connected to the power supply V. One end of the source diode (SD) and one end the capacitor Cj are connected to a predetermined power supply. An output voltage-V is output from a source of the pinch-off transistor pTr. An ammeter A detects an output current (photocurrent).

In such a circuit, by performing the reset, the source of the pinch-off transistor pTr connected to the capacitor Cj is reset to a predetermined voltage. By incidence of light thereafter, the electrons flow into the source 104 through the pinch-off transistor pTr and the source diode (SD). As a result, the voltage of the source is reduced, and the current at this time can be detected by the ammeter A.

Figure 4:
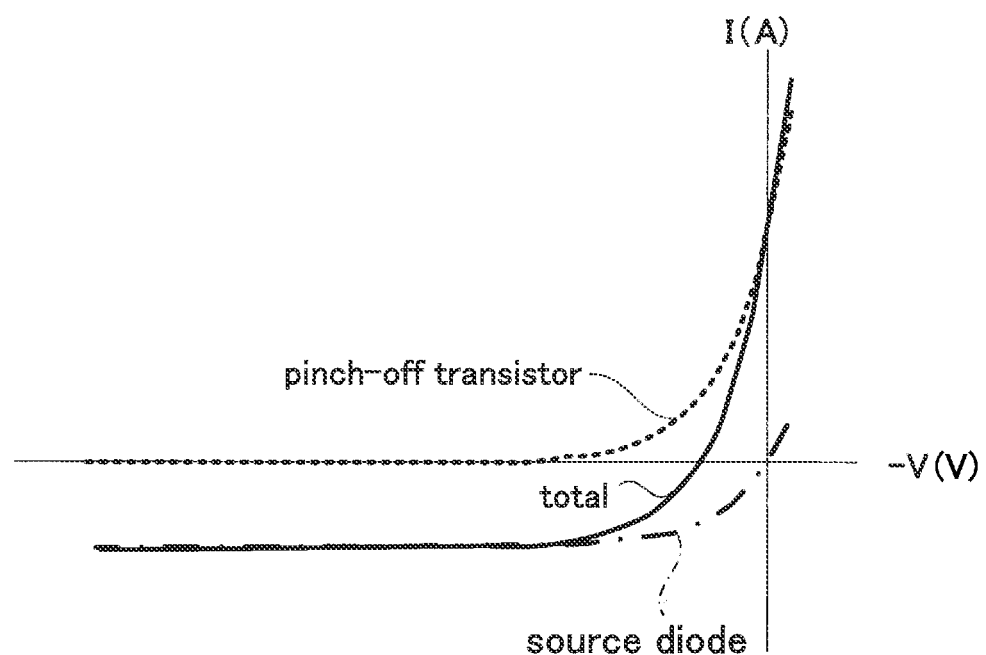
FIG. 4 is a diagram illustrating the VI characteristics of the phototransistor 10.

FIG. 4 is a diagram illustrating the VI characteristics of the phototransistor 10. In the drawing, a lateral axis indicates a voltage-V (plus on left side, and minus on right side) of the source 104, and a vertical axis indicates an output current I.

As illustrated, in the source diode (SD), a reverse current flows until the source voltage becomes zero. The reverse current is gradually reduced as the source voltage approaches from a predetermined negative voltage to 0 V, and the current becomes substantially zero when the source voltage is 0 V. When the source voltage is increased from 0 V, the current of the source diode (SD) is exponentially increased. Further, in the pinch-off transistor pTr in a state where the gate voltage is sufficiently low, the current is zero when the source voltage is high. When the source voltage becomes a predetermined negative voltage, the current starts to flow. Thereafter, the current is exponentially increased as the source voltage is increased as a negative value.

A total current of the pinch-off transistor pTr and the source diode (SD) becomes positive from negative before the source voltage becomes zero, and is then sharply increased. In other words, in the phototransistor 10, a predetermined negative current flows until the source voltage becomes the predetermined negative voltage. Thereafter, the current becomes positive at the time when the source voltage is negative, and the predetermined positive current flows at the time when the source voltage is zero. Further, when the source voltage becomes positive, the current is exponentially increased.

The VI characteristics of the source diode (SD) are expressed by the following expression. The current of the phototransistor 10 is a sum of the following currents.

$$I = Is * \exp((-V/Vt) - 1)$$

The VI characteristics of the pinch-off transistor pTr are expressed by the following expression.

$$I = I0 * \exp((-V/Vt))$$

In the expressions, I is the output current, and −V is a generated voltage. In addition, Is is a saturation current, Vt is a thermal voltage where Vt=kT/q (q is elementary charge, k is Boltzmann constant, and T is absolute temperature), and I0 is a current coefficient of the pinch-off transistor pTr.

Photodiode Operating in Photovoltaic Mode

Figure 5A:
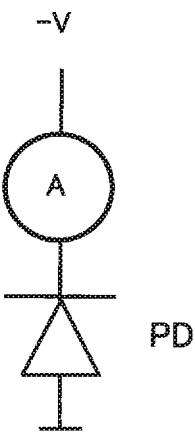
FIG. 5A is a diagram illustrating a configuration for detecting an output current of a common photodiode (PD)

FIG. 5A is a diagram illustrating a configuration for detecting an output current of a common photodiode (PD). In this example, an anode of the photodiode (PD) is connected to a predetermined power supply (e.g., ground). A cathode is a voltage output end outputting the voltage-V through an ammeter A. When light enters the photodiode (PD), a current flows through the photodiode (PD), and an output voltage is increased in a minus direction.

Figure 5B:
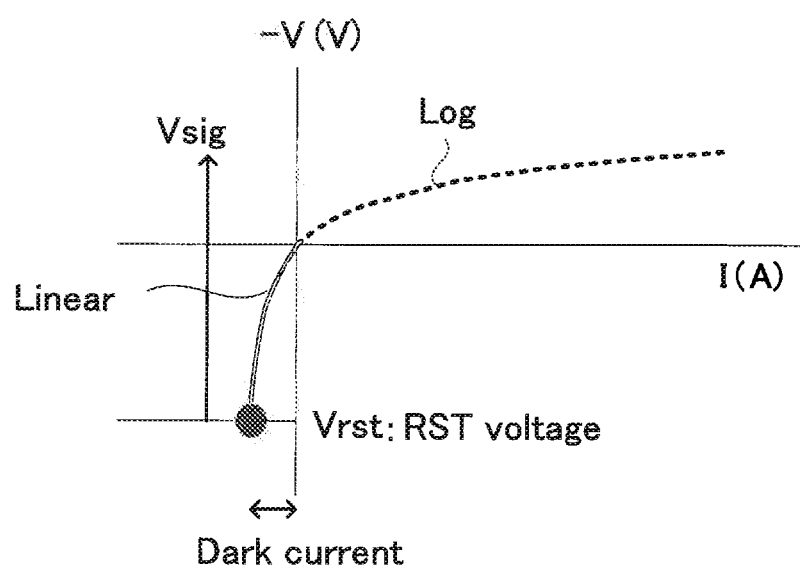
FIG. 5B is a diagram illustrating VI characteristics of the photodiode (PD)

FIG. 5B is a diagram illustrating VI characteristics of the photodiode (PD). The photodiode (PD) operating in the photovoltaic mode operates in a linear (Linear) region with high sensitivity and in a logarithmic (Log) region having low output and a wide dynamic range. Generally, a reverse bias of the photodiode (PD) is used in the linear region, and a forward bias is used in the logarithmic region.

In the photodiode (PD), the output voltage is reset to a reset voltage Vrst of the reverse bias, charges (electrons in this case) are accumulated by incidence of light, and a cathode voltage (i.e., output voltage) is reduced. In FIG. 5B, a lateral axis indicates the output current I, and a vertical axis indicates the output voltage-V. In FIG. 5B, a solid line as the reverse bias indicates the linear region, and a dashed line as the forward bias indicates the logarithmic region. The output voltage is reset to a positive reset voltage Vrst, and the output voltage greater than the reset voltage Vrst is a signal voltage Vsig.

At this time, when the reverse bias is applied to the diode, a dark current occurs in the linear region. The dark current is not a signal current. Therefore, the dark current becomes noise and deteriorates the characteristics.

Setting of Reset Voltage

In the present embodiment, in the power supply V in FIG. 1, the source voltage at the time of reset is set to Vrstz.

Figure 6:
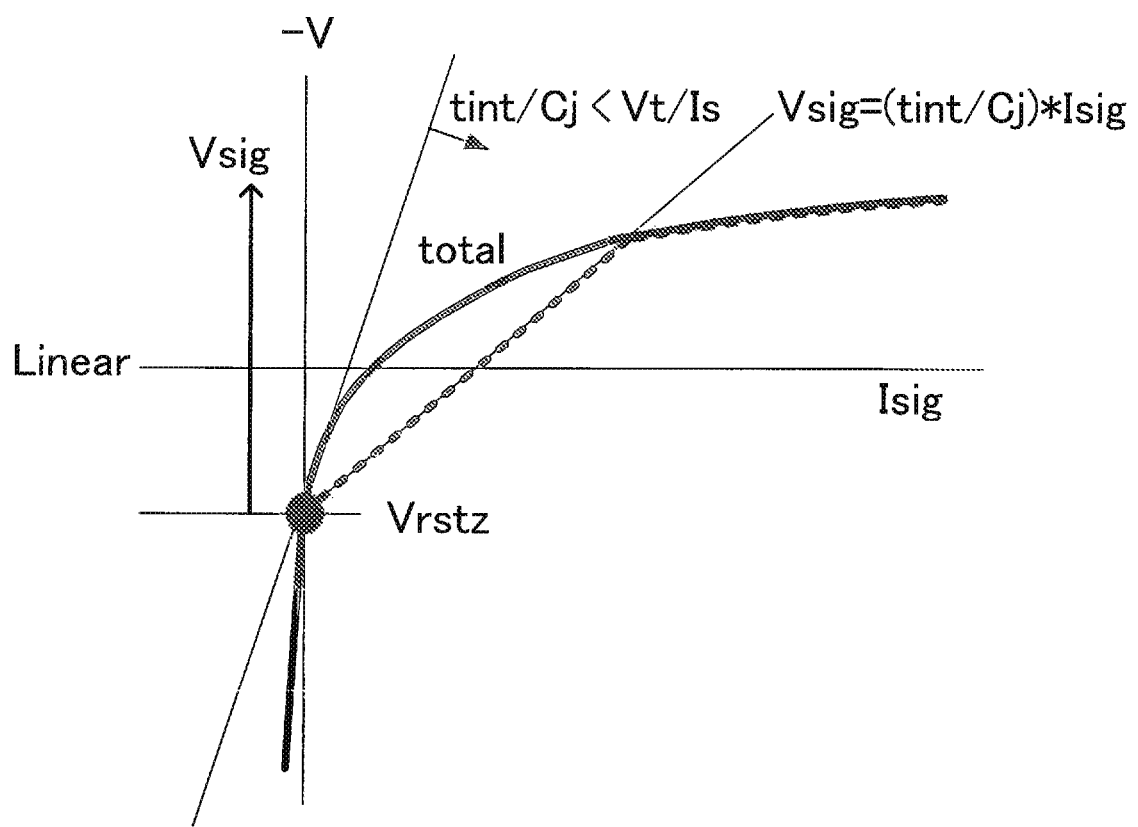
FIG. 6 is a diagram illustrating setting of a reset voltage Vrstz.

FIG. 6 is a diagram illustrating setting of the reset voltage Vrstz. In a case where a charge accumulation time of the phototransistor 10 is denoted by tint, the signal voltage Vsig accumulated in the capacitor Cj in FIG. 3 can be expressed as follows, $$Vsig = Isig * t\ int/Cj.$$

A time from one reset to readout of the signal is an exposure time, and readout of the signal is normally performed immediately before reset.

When a lateral axis indicates a signal current Isig and a vertical axis indicates the output voltage −V, a curve indicated by total in FIG. 4 becomes a curve illustrated by a thick line in FIG. 6. Note that the source voltage is set to a value on the most positive side at which the current becomes zero, namely, is set to the reset voltage Vrstz.

A straight line expressed by Vsig=Isig*tint/Cj can be drawn as illustrated in FIG. 6. An intersection of the straight line expressed by Vsig=Isig*tint/Cj and a log curve (thick line of VI characteristics) is a Lin-Log point, namely, a boundary point of the linear region and the logarithmic region.

More specifically, a region where the signal current is less than the signal current at the boundary point is the linear region with high sensitivity, and a region where the signal current is greater than the signal current at the boundary point is the logarithmic region having a wide dynamic range.

As described above, an approximate expression of a condition where both of the linear region and the logarithmic region appear in the forward region is as follows, $$t\ int/Cj < Vt/Is.$$

In recent years, a photocurrent Is obtained by single exposure is reduced. Even when the charge accumulation time tint is 33 ms (=30 frames/second), the output voltage at the boundary point is about 200 mV in the forward direction, and a normal photoelectric conversion element is usable.

In contrast, in a case of tint/Cj>Vt/Is, the linear region cannot be created in the forward direction.

Figure 7:
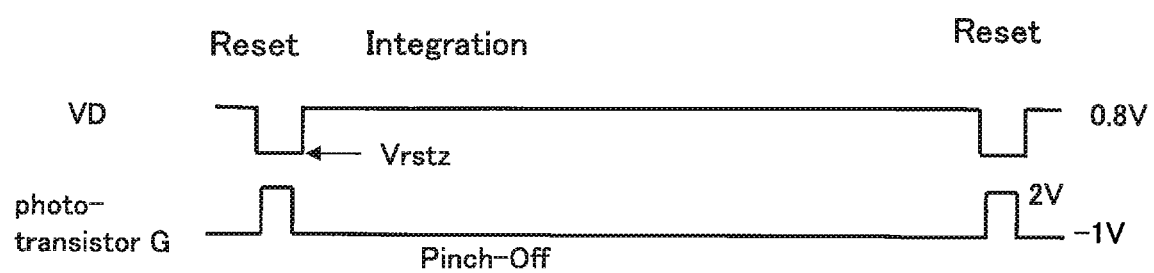
FIG. 7 is a timing chart of the pixel circuit according to a present embodiment.

FIG. 7 is a timing chart of the pixel circuit according to the present embodiment. First, a drain voltage VD of the phototransistor 10 determined by the power supply V is set to an appropriate positive voltage (e.g., 0.8 V) at a normal time. At the time of reset, the drain voltage VD is set to the above-described reset voltage Vrstz. When the gate voltage is set to the H level (e.g., 2 V) while the drain voltage is set to Vrstz, the phototransistor 10 is turned on, and the source voltage is reset to Vrstz. In a case where the reset ends, the gate voltage is set to a sufficiently negative voltage (e.g., −1 V) at the normal time. As a result, the phototransistor 10 is put into the pinch-off state, and the charges (electrons) corresponding to incidence of light are accumulated.

As described above, when the voltage is reset to Vrstz at which the current becomes zero, the above-described dark current becomes zero. This makes it possible to eliminate noise and to improve characteristics.

Integration Circuit

Figure 8:
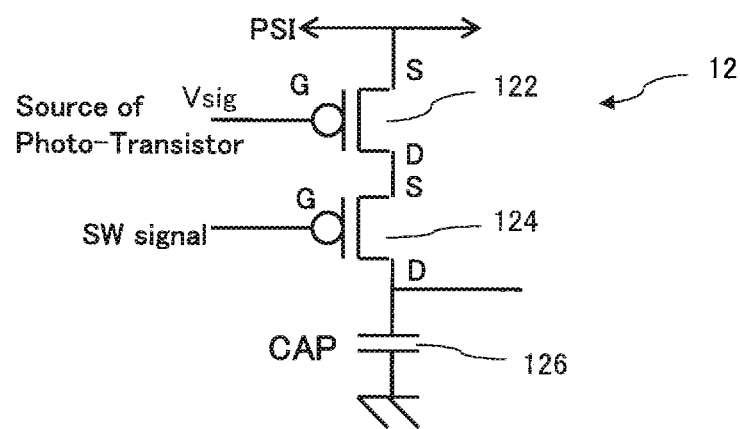
FIG. 8 is a diagram illustrating an exemplary configuration of an integration circuit 12 using a p-channel FET.

FIG. 8 is a diagram illustrating an exemplary configuration of the integration circuit 12 using a p-channel FET. The integration circuit 12 includes a p-channel transistor 122 having a source connected to a power supply PSI, a switch transistor 124 having a source connected to a drain of the p-channel transistor 122, and an integration capacitor 126 connected to a drain of the switch transistor 124. The p-channel transistor 122 and the switch transistor 124 are p-channel FETs.

A gate of the p-channel transistor 122 is connected to the source of the phototransistor 10, and causes a current corresponding to the source voltage of the phototransistor 10 to flow. In other words, the current corresponding to the amount of light entering the phototransistor 10 flows to the p-channel transistor 122. A gate of the switch transistor 124 is supplied with a signal SWsig. The signal SWsig is turned off when a voltage of the integration capacitor 126 is read out.

Operation of Pixel Circuit

Figure 9:
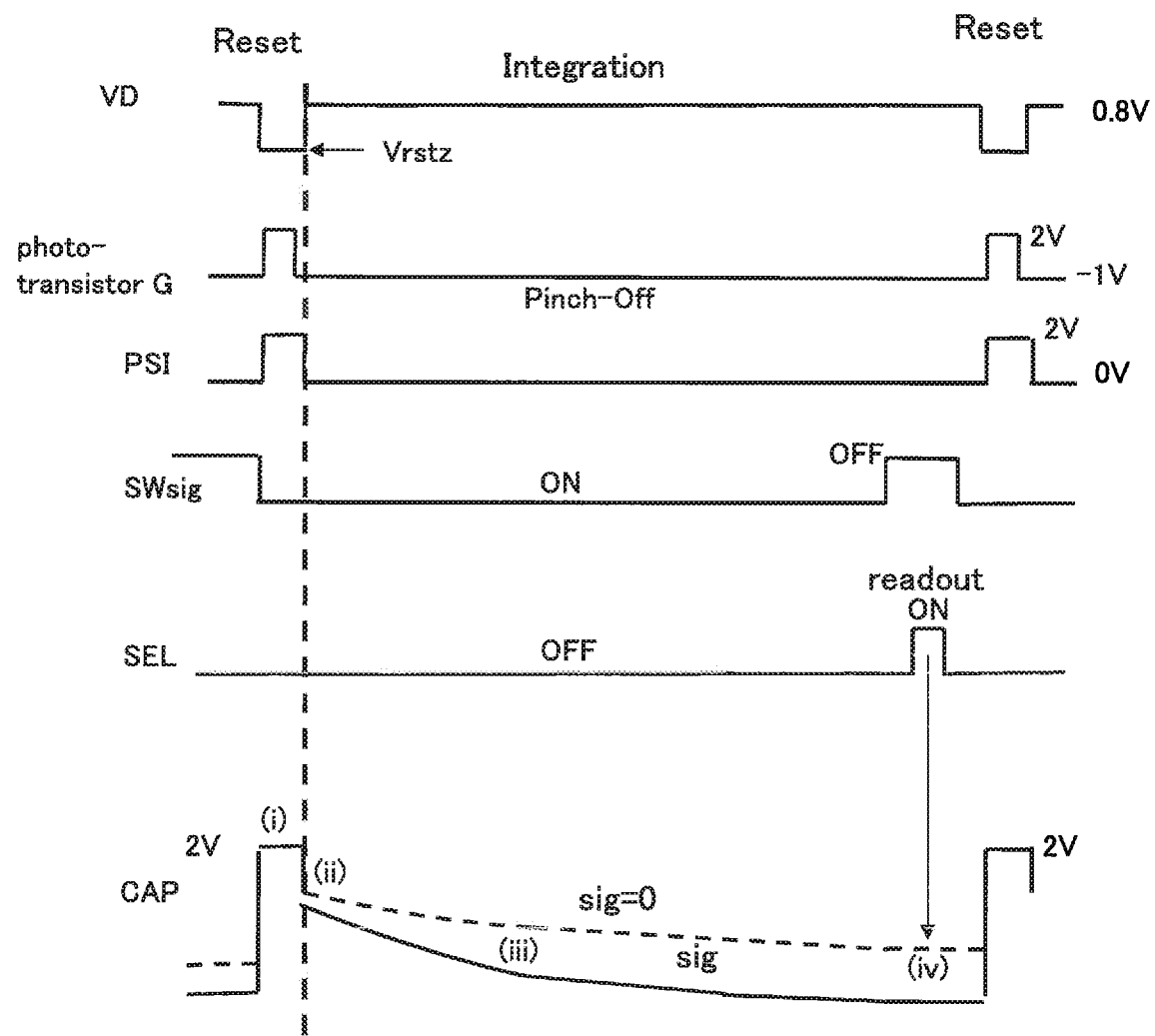
FIG. 9 is a timing chart illustrating operation of the pixel circuit.

FIG. 9 is a timing chart illustrating operation of the pixel circuit. As described above, before integration of the light incident amount starts, the source voltage of the phototransistor 10 is reset to Vrstz. Further, the voltage of the gate electrode 116 (denoted by G in drawing) is set to a minus voltage (−1 V). As a result, the phototransistor 10 is sufficiently turned off, and is put into the pinch-off state.

In this state, the electrons generated by light entering the phototransistor 10 enter from the PN junction to the source region, which reduces the voltage of the source 104. As illustrated on a left side in FIG. 6, when the electrons enter the source 104, the corresponding signal sig is generated, and the potential is reduced from Vrstz.

At this time, the voltage of the drain 102 is 0.8 V. Accordingly, the electrons move from the source 104 having the low voltage to the drain 102. The movement of the electrons is the sub-threshold current that is the current exponentially varied as described above. Therefore, the source voltage is logarithmically varied because of movement of the electrons caused by photoelectric conversion.

The gate of the p-channel transistor 122 is connected to the source 104 of the phototransistor 10.

Next, integration operation is described. In FIG. 9, timings for four stages (i) to (iv) are illustrated. Therefore, each of the stages is described.

(i) In the integration circuit 12, the power supply PSI becomes the H level (e.g., 2 V) once at the reset timing. At this time, the source voltage of the phototransistor 10 is Vrstz, the p-channel transistor 122 is turned on, and the channel voltage and the source voltage also become 2 V. In other words, holes are supplied from the drain to the source to which the integration capacitor 126 is connected. Further, since the signal SWsig is at an L level and the switch transistor 124 is on, the voltage of the integration capacitor 126 is set to 2 V.

(ii) Next, when the voltage of the power supply PSI returns to 0 V, the drain voltage of the p-channel transistor 122 returns to 0 V, the source voltage becomes a voltage corresponding to the gate voltage, and the corresponding holes returns from the source to the drain.

In other words, by operation of the drain in a fill and spill mode, the voltage of the integration capacitor 126 is set to a voltage corresponding to the source voltage of the phototransistor 10.

(iii) The source voltage of the phototransistor 10 is logarithmically reduced from Vrstz relative to the light incident amount by inflow of the carriers and the sub-threshold current. The voltage variation at the source of the phototransistor 10 corresponds to the signal sig. Further, the source voltage of the p-channel transistor 122 is varied corresponding to the source voltage of the phototransistor 10, and the current thereof is integrated by the integration capacitor 126. Accordingly, the voltage of the integration capacitor 126 is reduced corresponding to the signal sig.

(iv) After lapse of a predetermined integration time, the signal SWsig becomes the H level, and the switch transistor 124 is turned off. Further, when the row selection signal SEL becomes the H level, the row selection transistor 14b is turned on, and the output signal corresponding to the voltage of the integration capacitor 126 is output from the output line 18. In the above-described manner, the output signal corresponding to the light incident amount of the pixel is obtained.

As described above, in the present embodiment, the phototransistor 10 is used in the pinch-off state, to operate in the photovoltaic mode. This makes it possible to widen the dynamic range.

Further, the integration circuit 12 is interposed between the source electrode and the source follower transistor 14a. Accordingly, the signal charges relating to the light incident amount of the phototransistor 10 operating in the photovoltaic mode are integrated and output. This makes it possible to suppress flicker occurring in a case where an LED or the like is imaged.

In the above-described example, the n-channel FET is used for the phototransistor 10 and the p-channel FET is used for the integration circuit; however, the p-channel FET may be used for the phototransistor 10 and the n-channel FET may be used for the integration circuit.

Configuration of Image Sensor

Figure 10:
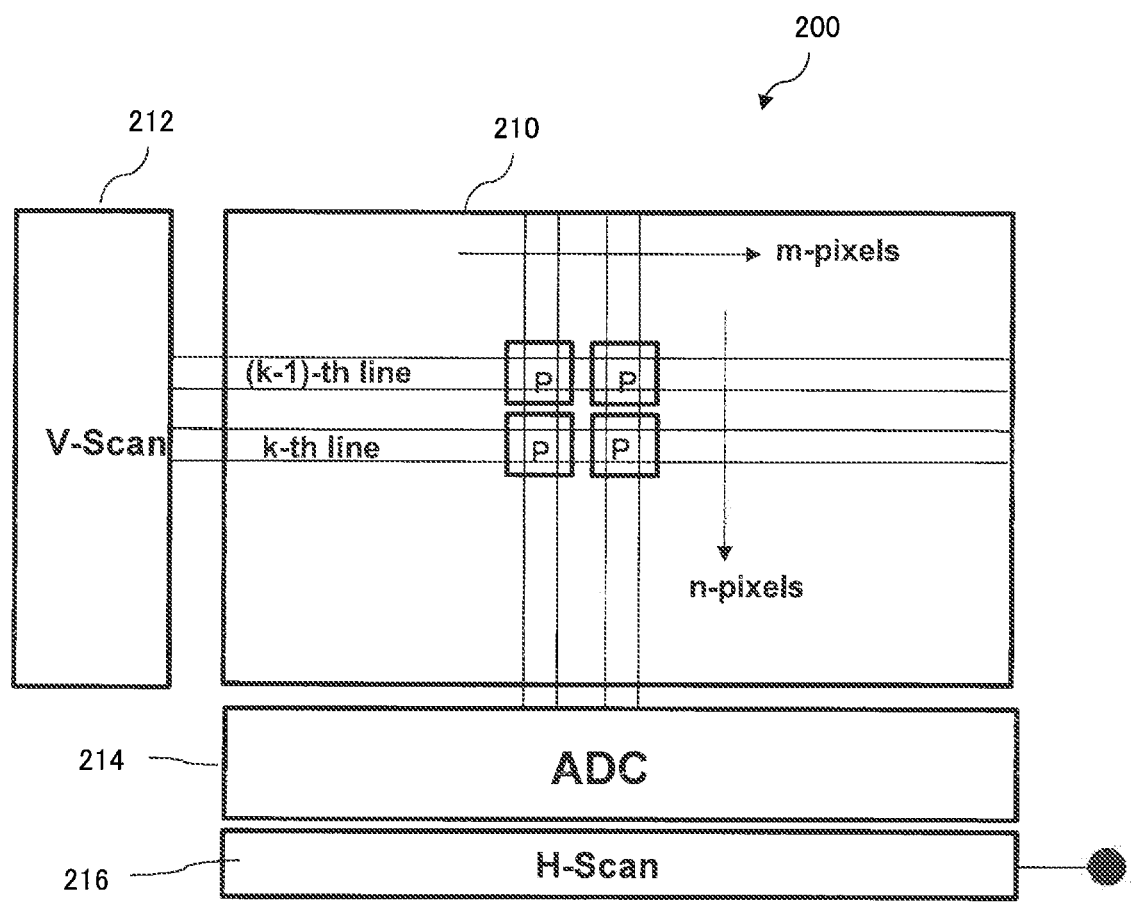
FIG. 10 is a diagram illustrating an image sensor 200 in which pixels are two-dimensionally arranged.

FIG. 10 is a diagram illustrating an image sensor 200 in which the above-described pixels are two-dimensionally arranged. A pixel array 210 includes pixels P as described above arranged in m columns*n rows (m*n), namely, includes m pixels in a horizontal direction and n pixels in a vertical direction. A vertical scan circuit (V-Scan) 212 sequentially selects rows of the pixels in the vertical direction. The pixels in each column are connected to an analog-to-digital converter (ADC) 214 by a readout line in the vertical direction. A horizontal scan circuit 216 is connected to the analog-to-digital converter 214, and image signals of the respective pixels are sequentially output from the horizontal scan circuit 216.

Figure 11:
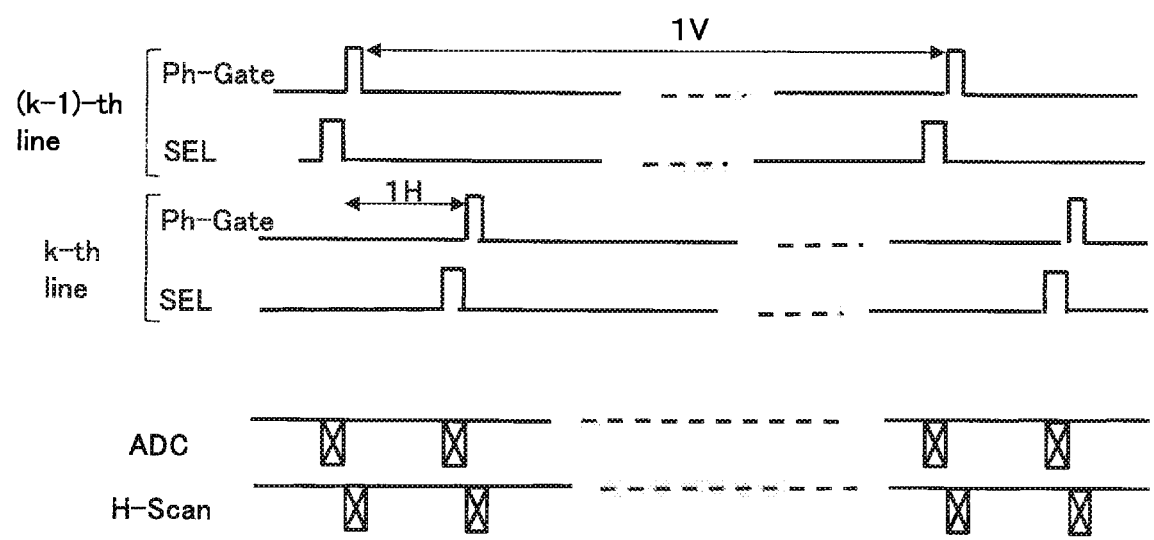
FIG. 11 is a timing chart illustrating operation timings of the image sensor 200.

FIG. 11 is a timing chart illustrating operation timings of the image sensor 200. In the drawing, the gate of the phototransistor 10 in FIG. 1 is denoted by Ph-Gate, and the row selection transistor 14b is denoted by SEL.

In a (k−1)-th row, the gate of the phototransistor 10 (Ph-Gate) is turned on and the source is reset. The reset is performed for each vertical period (1V). Exposure starts after one reset. In addition, a signal is read out shortly before next reset. As described above, the row selection transistor (SEL) is turned on through the integration by the integration circuit 12, and the signal is read out to the output line 18. The readout signal is supplied to the analog-to-digital converter 214, and is converted into a digital signal. The operation is simultaneously performed on m pixels in one horizontal line. Thereafter, the horizontal scan circuit 216 sequentially outputs the digital signals of the m pixels.

In a k-th row, the same operation is performed by shifting the horizontal period by 1H. Signals of all of the m*n pixels can be read out by repeating the operation n times.

Modification 1

Variation of the dark current of the source diode (SD) is large. To suppress occurrence of noise, resetting the current flow through the source diode (SD) to zero is effective. In other words, the source voltage is reset to a voltage where the current flow through the source diode (SD), illustrated by an alternate long and short dash line in FIG. 4 becomes zero, namely, is reset to 0 V. When the source voltage is reset to 0 V in the above-described manner, the positive current flows in the total characteristics are illustrated by a solid line.

Figure 12:
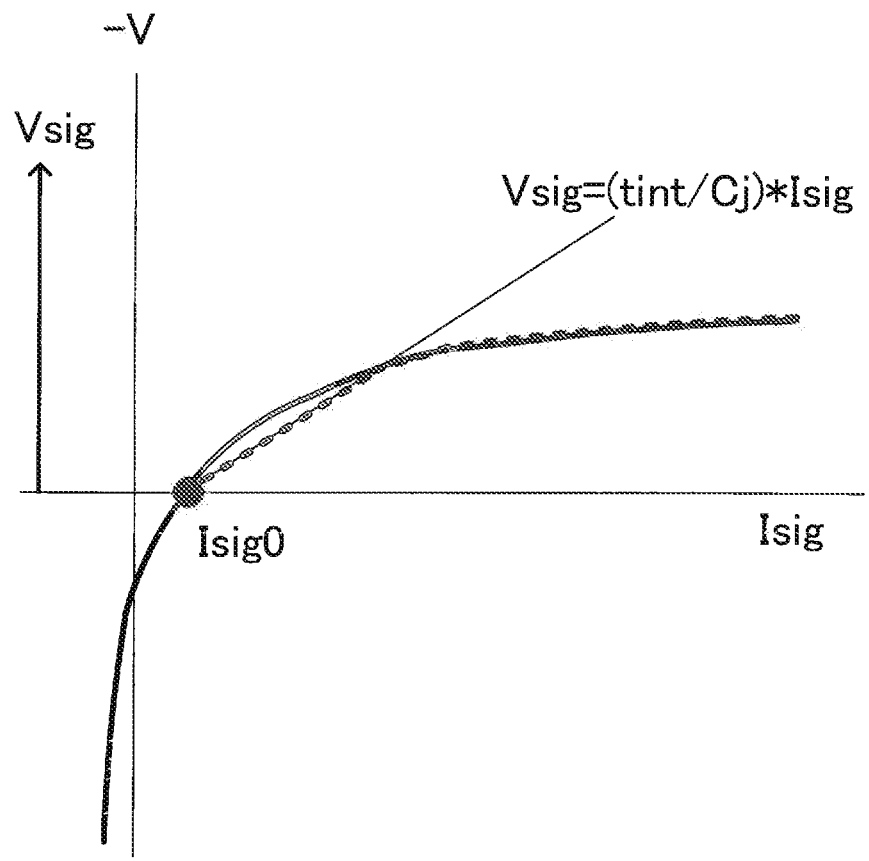
FIG. 12 is a diagram illustrating the VI characteristics of the phototransistor 10 in a case where reset is performed while a current flowing through a source diode (SD) is zero.

FIG. 12 is a diagram illustrating the VI characteristics of the phototransistor 10 in a case where reset is performed while the current flowing through the source diode (SD) is zero. As illustrated, when the source voltage is reset to 0 V, the positive signal current Isig flows at the time. In other words, the current in the direction opposite to the dark current in FIG. 4 flows. However, the dark current is the current flowing through the pinch-off transistor pTr, and variation of the dark current is less than variation of the dark current flowing through the source diode (SD). This makes it possible to suppress occurrence of noise.

Figure 13:
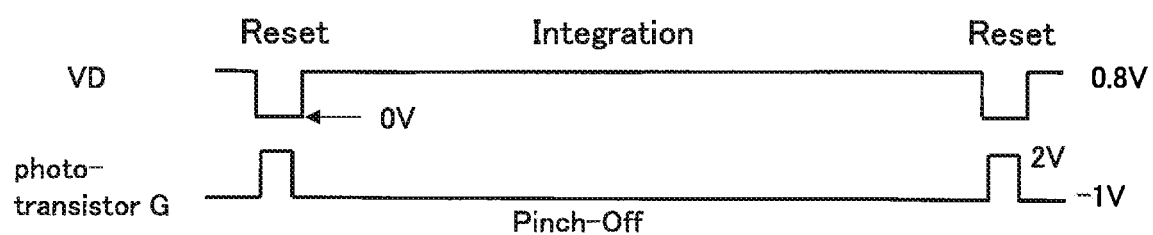
FIG. 13 is a timing chart of the pixel circuit according to the present embodiment in a case where a source voltage is reset to 0 V.

FIG. 13 is a timing chart of the pixel circuit according to the present embodiment in the case where the source voltage is reset to 0 V. As illustrated, the drain voltage is set to 0 V while the output voltage of the power supply V is 0 V. In this state, the gate voltage is changed to the high level, which makes it possible to reset the source voltage to 0 V.

Modification 2

In the above-described example, the phototransistor 10 is used. However, the reset according to the present embodiment is applicable to a photodiode.

Figure 14:
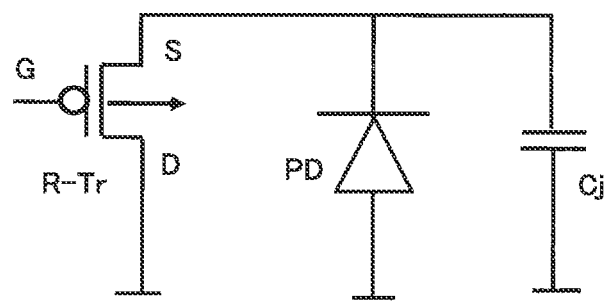
FIG. 14 is a diagram illustrating a circuit in a case of using the photodiode (PD)

FIG. 14 is a diagram illustrating a circuit in a case of using the photodiode (PD). The photodiode (PD) is provided on the semiconductor substrate. Further, a reset transistor R-Tr is provided on the semiconductor substrate while being isolated from the photodiode (PD). In this example, the reset transistor R-Tr is a p-channel transistor. The photodiode (PD) can accumulate a predetermined number of charges. Therefore, this is illustrated as the capacitor Cj. A capacitor for charge accumulation may be provided separately from the photodiode (PD).

A source of the reset transistor R-Tr and one end of the capacitor Cj are connected to a cathode of the photodiode (PD). An anode of the photodiode (PD), a drain of the reset transistor R-Tr, and the other end of the capacitor Cj are connected to a common power supply, for example, ground.

In such a configuration, the reset transistor R-Tr is turned off and no current flows through the reset transistor R-Tr during exposure. Therefore, signal charges flowing into the photodiode (PD) are accumulated in the capacitor Cj.

Figure 15:
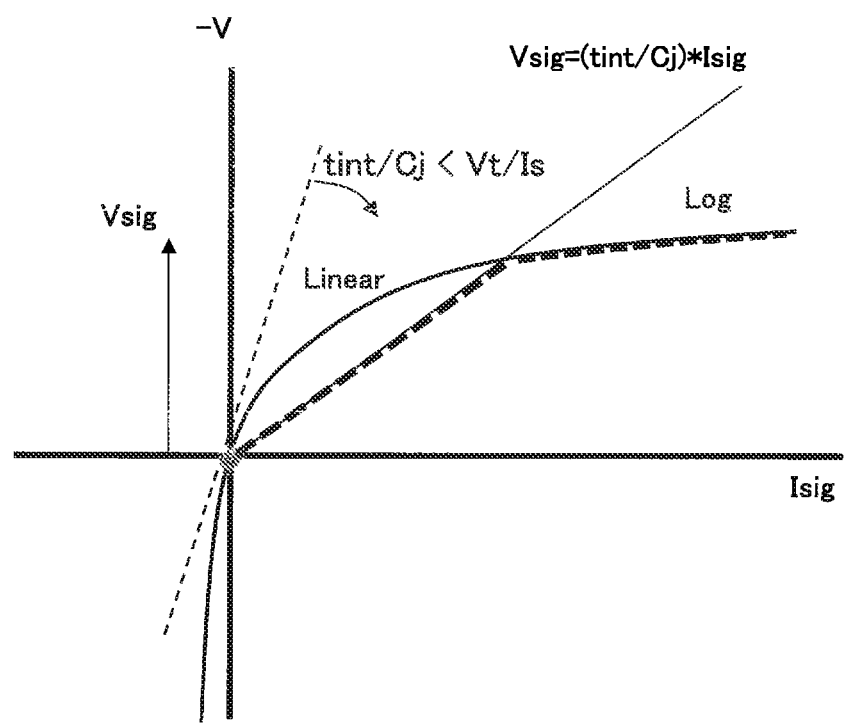
FIG. 15 is a diagram illustrating the VI characteristics of the photodiode (PD).

Accordingly, as illustrated in FIG. 15, a VI curve indicates characteristics passing through only an origin (point where voltage and current are both zero) of the photodiode (PD).

In this case, when the condition of tint/Cj<Vt/Is is satisfied, the linear region also appears in a region of −V>0. When the cathode of the photodiode (PD) is reset to 0 V, the dark current is zero, and the linear region can be obtained. Further, since the dark current is eliminated, low noise characteristics can be obtained at the same time.

What is claimed is:

1. A pixel circuit, comprising:
   a phototransistor including a source and a drain provided on both sides of a channel on a surface portion of a substrate, configured to receive, by a first region and a second region, inflow of photo-carriers generated by light entering the substrate, and configured to output a voltage signal from the one first region; and
   a blocking layer provided to cover lower sides of the second region and the channel, and configured to prevent the photo-carriers from directly flowing into the second region, wherein
   the phototransistor causes a sub-threshold current to flow between the source and the drain in a pinch-off state where photo-carriers pass through a bulk channel at a position separated from the surface in the channel,
   each of the source and the drain of the phototransistor is periodically reset to a reset voltage, and
   the reset voltage is set to cause a dark current of the phototransistor to become zero.

2. The pixel circuit according to claim 1, wherein
   the phototransistor is an n-channel transistor, and
   the first region is the source, and the second region is the drain.

3. The pixel circuit according to claim 1, wherein the reset voltage is a reverse biased voltage.

4. The pixel circuit according to claim 1, wherein
   an output circuit includes a p-channel transistor having a gate connected to the source of the phototransistor, and
   an integration capacitor connected to a source of the p-channel transistor, and
   a drain of the p-channel transistor operates in a fill and spill mode.

5. A pixel circuit, comprising:
   a phototransistor including a source and a drain provided on both sides of a channel on a surface portion of a substrate, configured to receive, by a first region and a second region, inflow of photo-carriers generated by light entering the substrate, and configured to output a voltage signal from the first region; and
   a blocking layer provided to cover lower sides of the second region and the channel, and configured to prevent the photo-carriers from directly flowing into the second region, wherein
   the phototransistor causes a sub-threshold current to flow between the source and the drain in a pinch-off state where the photo-carriers pass through a bulk channel at a position separated from the surface in the channel,
   each of the source and the drain of the phototransistor is periodically reset to a reset voltage, and
   the reset voltage is set to cause a bias voltage of the phototransistor to become zero.

6. The pixel circuit according to claim 5, wherein
   the phototransistor is an n-channel transistor, and
   the first region is the source, and the second region is the drain.

7. The pixel circuit according to claim 5, wherein a dark current in a forward direction flows when the reset is performed.

8. The pixel circuit according to claim 5, wherein the phototransistor includes a linear region in a forward bias.

9. The pixel circuit according to claim 6, wherein
   an output circuit includes a p-channel transistor having a gate connected to the source of the phototransistor, and
   an integration capacitor connected to a source of the p-channel transistor, and
   a drain of the p-channel transistor operates in a fill and spill mode.

10. A pixel circuit, comprising:
    a phototransistor including a source and a drain provided on both sides of a channel on a surface portion of a substrate, configured to receive, by a first region and a second region, inflow of photo-carriers generated by light entering the substrate, and configured to output a voltage signal from the first region; and
    a blocking layer provided to cover lower sides of the second region and the channel, and configured to prevent the photo-carriers from directly flowing into the second region, wherein
    the phototransistor causes a sub-threshold current to flow between the source and the drain in a pinch-off state where the photo-carriers pass through a bulk channel at a position separated from the surface in the channel,
    each of the source and the drain of the phototransistor is periodically reset to a reset voltage, and
    the reset voltage is set to a voltage between a voltage at which a dark current of the phototransistor becomes zero and a voltage at which a bias voltage of the phototransistor becomes zero.

11. The pixel circuit according to claim 10, wherein
    the phototransistor is an n-channel transistor, and
    the first region is the source, and the second region is the drain.

12. The pixel circuit according to claim 10, wherein
    an output circuit includes a p-channel transistor having a gate connected to the source of the phototransistor, and
    an integration capacitor connected to a source of the p-channel transistor, and a drain of the p-channel transistor operates in a fill and spill mode.

* * * * *